(12) United States Patent
Grant et al.

(10) Patent No.: US 6,212,087 B1
(45) Date of Patent: Apr. 3, 2001

(54) ELECTRONIC HALF BRIDGE MODULE

(75) Inventors: William Grant, Fountain Valley; Joshua Polack, Glendale, both of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/494,563

(22) Filed: Jan. 31, 2000

Related U.S. Application Data
(60) Provisional application No. 60/118,761, filed on Feb. 5, 1999.

(51) Int. Cl.[7] .................................................. H02M 1/00
(52) U.S. Cl. ............................ 363/144; 361/707; 361/715
(58) Field of Search .................................. 363/141, 144, 363/146, 145; 307/150; 361/679, 688, 704, 707, 714, 715, 718, 720, 722; 438/106, 121, 110, 133; 257/691–693, 696, 701, 773, 724, 704

(56) References Cited

U.S. PATENT DOCUMENTS 6,031,730 * 2/2000 Kroske ................................. 261/784
6,078,501 * 6/2000 Catrambone et al. ............... 361/704

* cited by examiner

*Primary Examiner*—Peter S. Wong
*Assistant Examiner*—Gary L. Laxton
(74) *Attorney, Agent, or Firm*—Ostrolenk, Faber, Gerb & Soffen, LLP

(57) ABSTRACT

A metal oxide semiconductor (MOSFET) half bridge module for use in a 42 volt internal combustion engine starter/alternator circuit. The module is a compact, high power handling device which has an extremely low inductance. This low inductance module supports the current and current slew rates necessary to properly operate in an internal combustion engine starter/alternator circuit across a wide temperature range. The module has a thermally conductive base. A plurality of lower circuit boards are adjacently positioned within the base along the same plane. At least one semiconductor device has a first surface, the first surface of the semiconductor device is mounted to one of the plurality of circuit boards. A common terminal has planar portion which is coupled to each of the plurality of lower circuit boards. An upper circuit board is in electrical contact with the plurality of lower circuit boards and includes a connector providing external access for drive signals for the semiconductor device.

43 Claims, 4 Drawing Sheets

ELECTRONIC HALF BRIDGE MODULE

CROSS-REFERENCE TO RELATED APPLICATION

This application is related to U.S. Provisional Application Ser. No. 60/118,761, filed Feb. 5, 1999, entitled HALF BRIDGE MODULE FOR STARTER/ALTERNATOR, the entirety of which is incorporated herein by reference.

BACKGROUND OF THE INVENTION

The present invention relates to an electronic bridge module, specifically to a high power metal oxide semiconductor half bridge module for an internal combustion engine starter/alternator circuit in which the module has a very low inductance.

Starting an internal combustion engine and rectifying the voltage generated by an alternator once the engine is running places high demands on the electronic circuitry required to support these functions. A typical starter/alternator requires minimum voltage drop at its input and an immediate torque current to mechanically "crank" the engine. In order to minimize voltage drop and supply immediate current, the start/alternator circuit path must have a low resistance and an extremely fast current slew rate (di/dt). The circuit must perform these functions under extreme temperature conditions such as might be found in a typical automotive environment. For example, the circuit must be capable of supplying a 650 amp current at −25° C. in a 42 volt system such that the current slew rate is faster than 1500 amps per microsecond.

An essential component of the starter/alternator circuit is a half bridge rectifier. The half bridge rectifier must be capable of supporting the characteristics described above. A typical half bridge rectifier is produced as a module employing metal oxide field effect transistor (MOSFET) devices. In order to achieve the desired performance characteristics and avoid device overvoltage and avalanche conditions, the low voltage silicon used in the MOSFET devices must provide a resistance path of less than 2 milliohms at 25° C., and a maximum module inductance of 12 nH. Of course, the module must be of a size small enough to be mounted at a spot convenient to its placement within the starter/alternator circuit, typically as part of a bus bar assembly located in a motor vehicle's engine compartment.

SUMMARY OF THE INVENTION

It is an object of the present invention to provide a high power half bridge module for a starter/alternator circuit in which the module is small, has a very low inductance, and can support the power requirements needed to start an internal combustion engine in a wide temperature range.

The present invention provides a rectifying module in which there is a thermally conductive base. A plurality of lower circuit boards are adjacently positioned within the thermally conductive base along a same plane. At least one semiconductor device has a first surface, the first surface of the semiconductor device is mounted to one of the plurality of lower circuit boards. A common terminal has a planar portion in which the planar portion is coupled to each of the plurality of lower circuit boards. An upper circuit board is in electrical contact with the plurality of lower circuit boards in which the upper circuit board includes a connector providing external access for drive signals for the semiconductor device.

Another aspect of the module of present invention further includes at least one contact pin. The contact pin is used to provide the electrical contact between the upper circuit board and one of the plurality of lower circuit boards.

As another aspect of the module of present invention, the contact pin includes a curved portion to form a resilient contact.

As still another aspect, the module of present invention further comprises two voltage terminals in which each of the two voltage terminals are coupled to a different one of the plurality of the lower circuit boards.

Another aspect of the module of present invention provides that the two voltage terminals extend from the plurality of lower circuit boards at differing distances.

As still yet another aspect of the module of present invention, the at least one semiconductor device further includes a second surface located opposite the first surface in which the second surface is coupled to one of the plurality of lower circuit boards by at least one wire bond.

As another aspect of the module of present invention, the at least one wire bond is "S"-shaped such that an attachment point on the one lower circuit board is angularly displaced from an attachment point on the second surface.

Another aspect of the present invention provides a module in which the at least one semiconductor device is a MOSFET device and the attachment point of the second surface is a source region.

As another aspect of the present invention, the module forms a half bridge rectifier.

As a further aspect of the present invention, the module is implemented in a 42 volt internal combustion engine starter/alternator circuit.

The present invention provides, as still another aspect, that the total package inductance of the module is less than approximately 8.4 nanoHenries.

As a further aspect of the module of the present invention, one of the voltage terminals is a negative terminal and the module further comprises a resistor and capacitor connected in a parallel arrangement between the negative terminal and the common terminal.

Another aspect of the invention provides that, the total thickness of the module is less than approximately 0.75 inches.

The present invention also provides a half bridge rectifying module for use in an internal combustion engine starting/alternator circuit, in which the module has a thermally conductive base. A plurality of lower circuit boards are adjacently positioned within the thermally conductive base along a same plane. At least one MOSFET semiconductor device has a first surface, the first surface of the MOSFET semiconductor device is mounted to one of the plurality of lower circuit boards. A common terminal has a planar portion coupled to each of the plurality of lower circuit boards. An upper circuit board is in electrical contact with the plurality of lower circuit boards and includes a connector providing external access for drive signals for the MOSFET semiconductor device.

As still another aspect, the present invention provides a rectifying module in which there is a thermally conductive base. A lower circuit board is positioned within the thermally conductive base. At least one MOSFET semiconductor device has a first surface, which is a drain surface, mounted to the lower circuit board, and a second surface opposite the first surface which is coupled to the lower circuit board by at least one "S"-shaped wire bond, in which the attachment point on the lower circuit board is angularly displaced from an attachment point on the second surface. A common terminal has a planar portion, the planar portion is coupled to the lower circuit board. A plurality of voltage terminals are coupled to the lower circuit board and extend at different distances therefrom. An upper circuit board is in electrical contact with the lower circuit board, the upper circuit board includes a connector providing external access for drive signals for the MOSFET semiconductor device.

Other features and advantages of the present invention will become apparent from the following description of the invention which refers to the accompanying drawings.

BRIEF DESCRIPTION OF THE DRAWING(S)

FIG. 1. is a top view of a low inductance half bridge module of the present invention.

Figure 1:
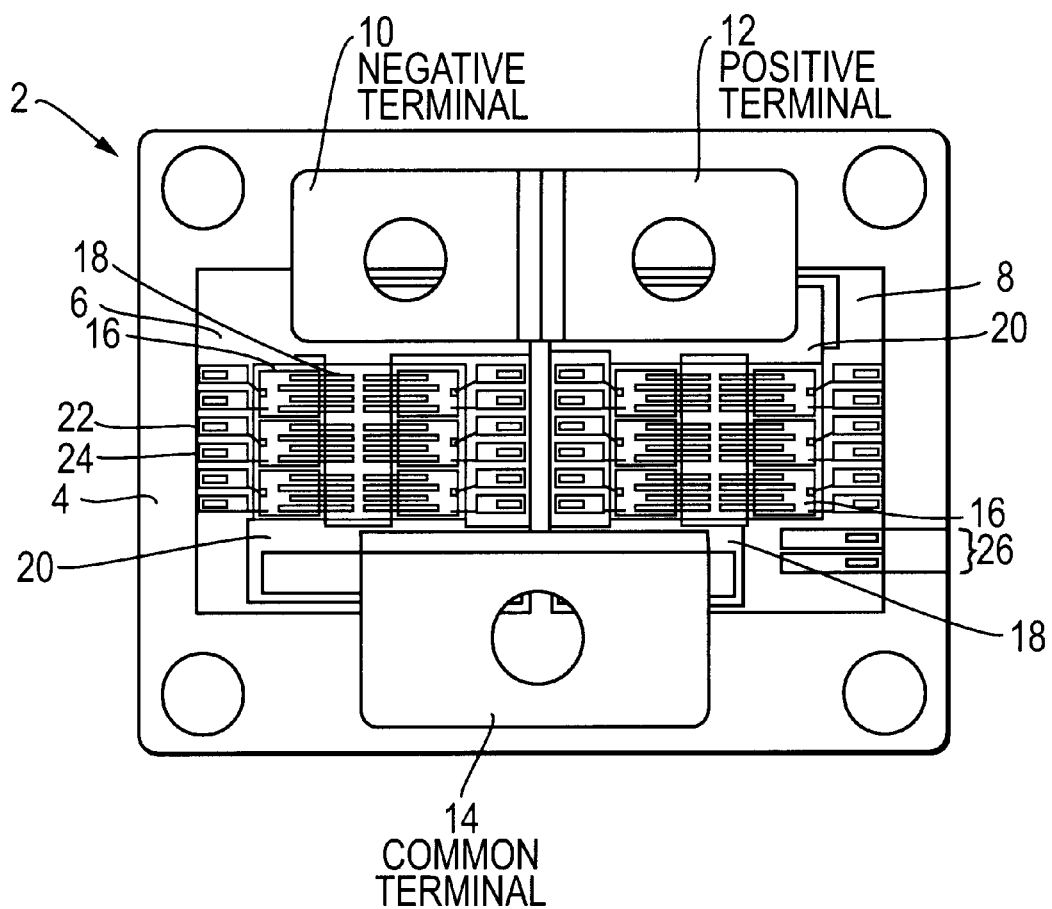

For the purpose of illustrating the invention, there is shown in the drawings a form which is presently preferred, it being understood, however, that the invention is not limited to the precise arrangement and instrumentality shown.

DETAILED DESCRIPTION OF THE INVENTION

Initially, it is noted that like reference numerals on the different figures refer to like elements. As shown in FIG. 1., an example of a low inductance half bridge module 2 in accordance with the present invention is assembled with a base 4, two MOSFET circuit boards 6 and 8, an upper printed circuit board (shown as reference 42 on FIG. 4) and a cover (shown as reference 48 on FIG. 5). MOSFET circuit boards 6 and 8 are positioned within the base 4 such that they lie adjacent to one another and are arranged in a longitudinally planar relationship to one another. A negative voltage terminal 10 is mounted to MOSFET circuit board 6. Mounted to MOSFET circuit board 8 is a positive voltage terminal 12. A common terminal 14 is mounted such that it is in electrical contact with both circuit boards. A number of MOSFET devices 16 are mounted to each of MOSFET circuit boards 6 and 8. The base and cover may be fabricated from any strong, thermally conductive material such as AlSiC. MOSFET circuit boards 6 and 8 are each patterned to define a source bus 18, a drain bus 20, gate connection pads 22 and source sense pads 24. In addition, MOSFET circuit board 8 is patterned to support a thermistor (not shown) mounted to the thermistor contact pads 26 for temperature sensing.

The MOSFET circuit boards 6 are arranged such that the source contact bus 18 of MOSFET circuit board 6 is in electrical contact with the negative terminal 10. The drain contact bus 20 of that same circuit board is in electrical contact with the common terminal 14. Similarly, the drain contact bus 20 of MOSFET circuit board 8 is in electrical contact with the positive terminal 12, and the source contact bus 18 of that same circuit board is in electrical contact with the common terminal 14. The negative terminal 10 and the positive terminal 12 can be laminated with an insulating material in the non-electrical contact regions such that they can be located close together within the module 2. Close placement of the positive and negative terminals saves space and has been advantageously found to provide a lower total induction for the module.

Figure 2:
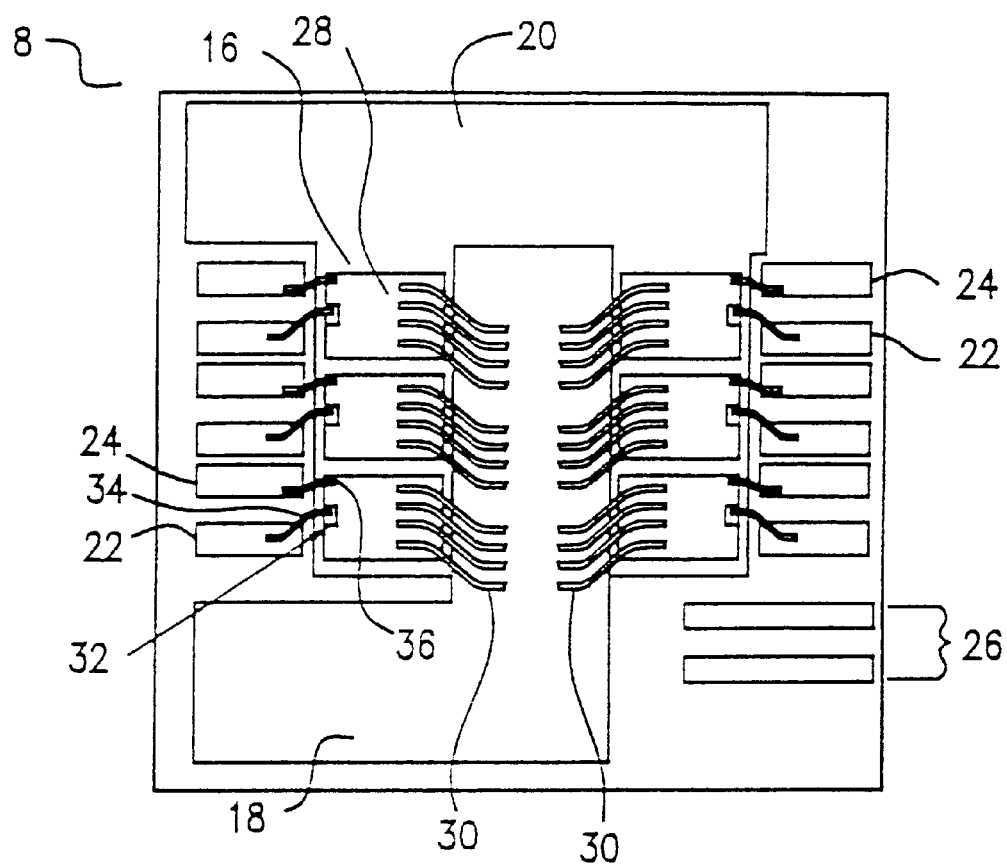
FIG. 2 is a perspective view of a MOSFET circuit board of the present invention.

MOSFET circuit board 8 of the present invention is shown in FIG. 2. MOSFET circuit board 8 and MOSFET circuit board 6 are identically patterned except for the addition of thermistor contact pads 26 on MOSFET circuit board 8. As such, the description of MOSFET circuit board 8 should be though of as also describing MOSFET circuit board 6. Of course, MOSFET circuit board 6 and MOSFET circuit board 8 can instead be manufactured as a single circuit board.

Each MOSFET device 16 is mounted to the MOSFET circuit board 8 such that the drain contact (not shown) is in electrical contact with drain contact bus 20. The source contact 28 of each MOSFET device 16 is connected to the source contact bus 18 by a plurality of wire bonds 30. Each wire bond 30 is shaped such that its contact point on the source contact bus 18 is not directly opposite its contact point on the MOSFET device 16, but rather is slightly offset, i.e., it is angularly displaced, thereby causing the wire bond to take the form of an "S" shape. Although a straight wire bond can be used, offset contact mounting provides a lower induction than does the straight wire bond. For example, testing has unexpectedly shown that the "S" shape results in a 1 nanoHenry reduction in total module induction.

The gate contact 32 of each MOSFET device 16 is attached to a respective gate connection pad 22 via a wire bond 34, and the source contact 28 is additionally connected to a respective source sense pad 24 via a wire bond 36. This allows for a convenient way to establish the gate to source voltage necessary to switch the MOSFET device 16.

Figure 3:
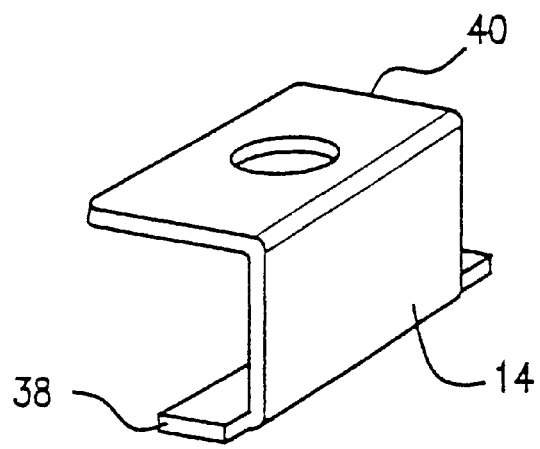
FIG. 3 is a perspective view of a common terminal of the present invention.

FIG. 3 shows a perspective view of the common terminal 14 of the present invention. The common terminal 14 is preferably arranged to have a shorter shape planar portion 38 positioned under an upper portion 40. The shorter shape planar portion 38 provides physical and electrical contact with circuit boards 6 and 8. The shorter shape portion 38 of the terminal 14 combined with the contact region being positioned under the upper portion 40 has been found to provide a lower induction than taller terminals and terminals in which the base is positioned outside the upper portion, i.e., in an "S" shape. Also, the dual heights, i.e., lengths of the negative terminal 10 and the positive terminal 12 allow for a fully laminated bus in the case where the module 2 is as part of a bus bar assembly. This is accomplished such that, when assembled, the negative terminal 10 and the positive terminal 12 extend from their respective MOSFET circuit board 6 and 8 at differing lengths.

Figure 4:
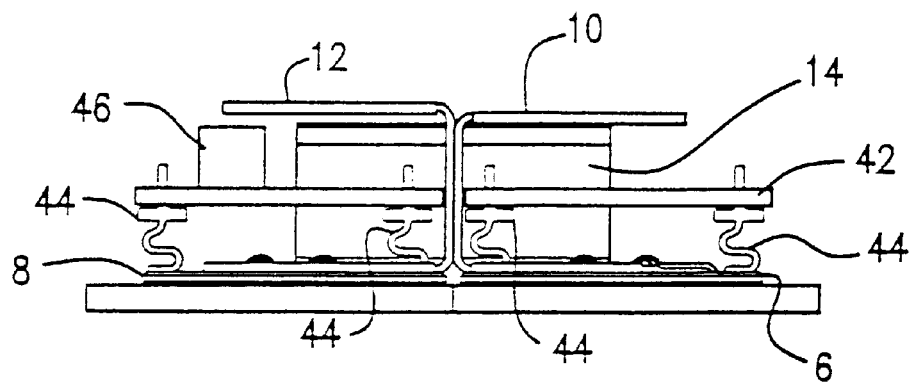
FIG. 4 is a side view of the low inductance half bridge module.

FIG. 4 shows a side view of the uncovered module. In particular, upper circuit board 42 is shown electrically connected to MOSFET modules 6 and 8 by contact pins 44. Contact pins 44 are used to provide an electrical path from gate connection pads 22 and source sense pads 24 to the upper circuit board 42. Although shown as curved so as to provide resilient contact pressure, the contact pins 44 may also be straight. An external connector 46 is mounted to the upper circuit board to provide an external point of connection for the MOSFET gates and source senses.

Figure 5:
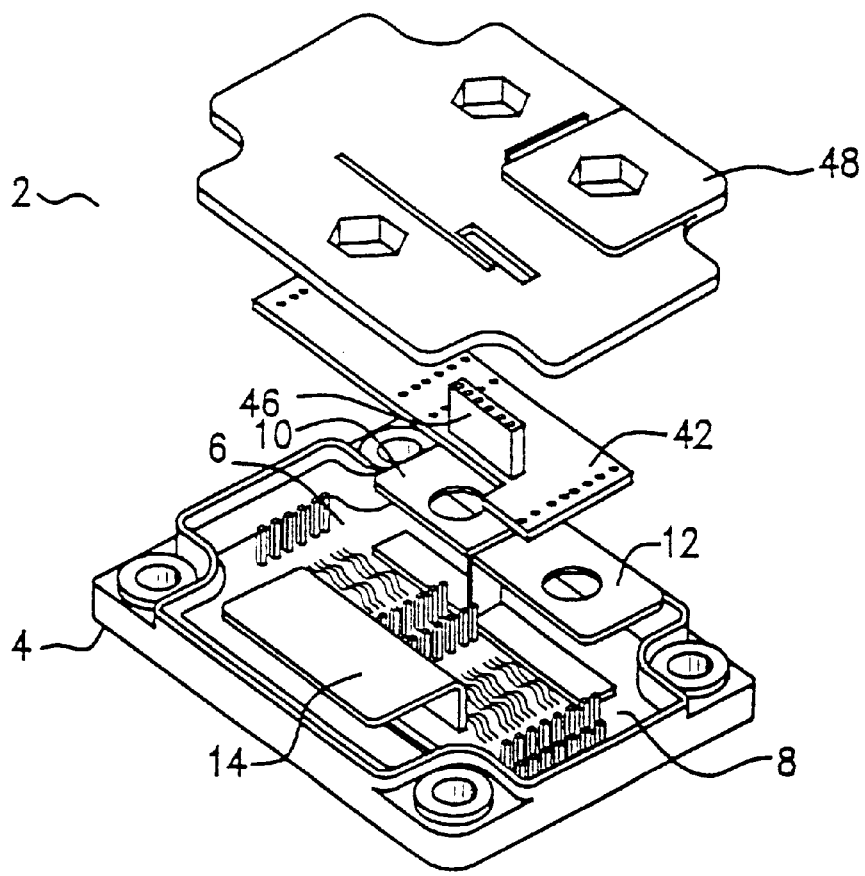
FIG. 5 is an assembly view of the low inductance half bridge module.

FIG. 5 shows a view of the module 2 assembly. Cover 48 is arranged such that it mates with base 4 and provides external access to the negative terminal 10, the positive terminal 12, the common terminal 14 and the external connector 46.

Module inductance is minimized when the path from the common terminal 14 to the negative and positive terminals is kept as short as possible. As shown in FIGS. 1 and 2, path length in the inventive device is minimized by using 2 pairs of 3 MOSFET devices 18 while still providing the current carrying capabilities necessary to start an internal combustion engine. Module inductance is further minimized in the inventive device by placing the gate connection pads 22 and source sense pads 24 as close together as possible and by keeping the length of the wire bonds as short as possible.

The module 2 is assembled as follows. First, the MOSFET devices 16 are attached to the MOSFET circuit boards 6 and 8. Additional devices (not shown), such as the thermistor, are also attached to the MOSFET circuit board a this time. Next, the wire bonds 30, 34 and 36 are made from the MOSFET devices 16 to their respective contact points on the MOSFET circuit boards 6 and 8. The assembled MOSFET circuit boards 6 and 8 are tested to ensure proper operation and are then affixed to the base 2. Terminals 10, 12 and 14 are attached along with upper circuit board 42 (via contact pins 44) to the assembled MOSFET circuit boards 6 and 8. The cover 48 is attached to the base, and the module is then potted.

Figure 6:
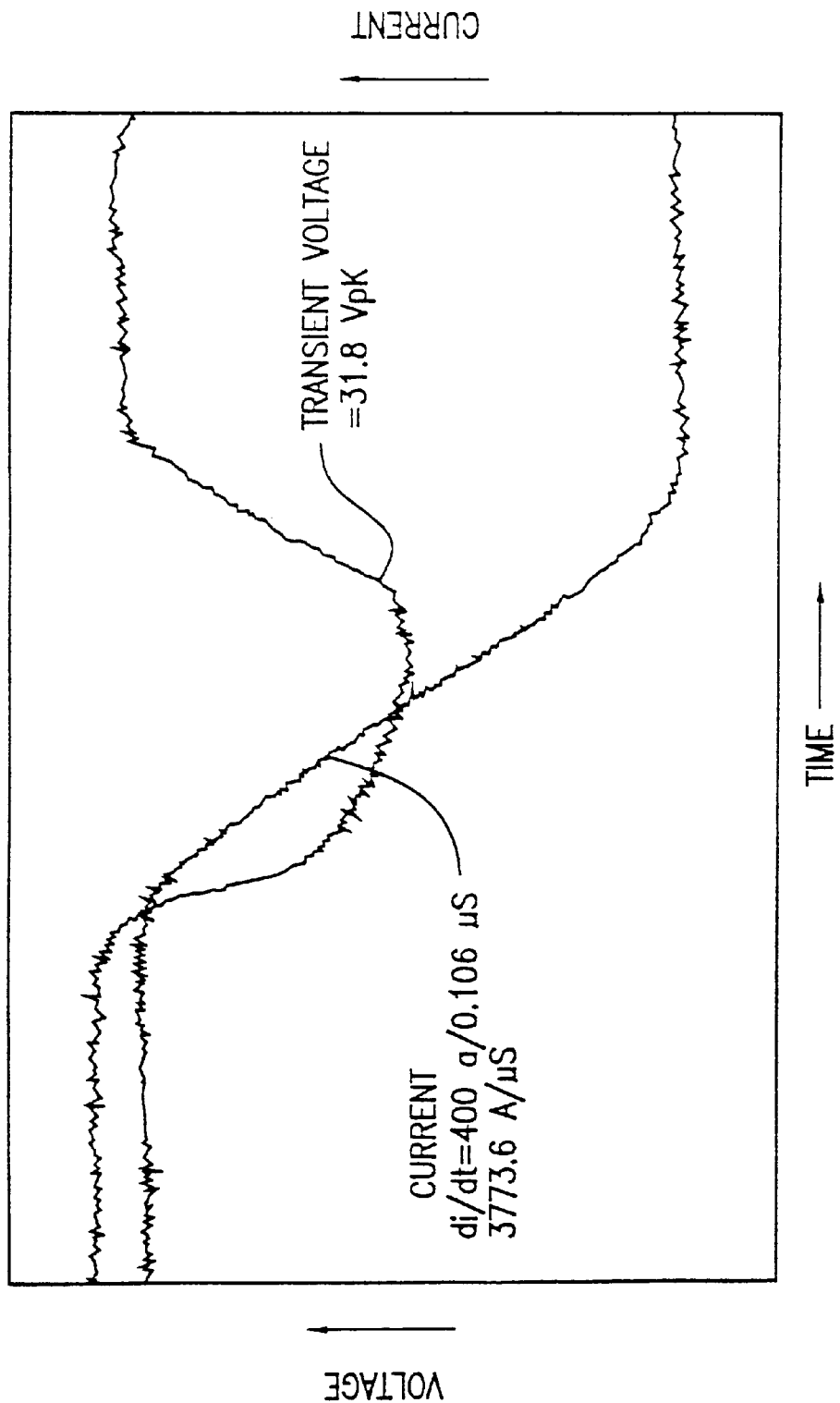
FIG. 6 is a graph showing the inductive characteristics of the module.

As shown in FIG. 6, the above described embodiment of the invention has been tested as providing a maximum total package inductance of approximately 8.4 nanoHenries. The module is shown in FIG. 6 as capable of supporting a current slew rate in excess of 3700 amps per microsecond. This low inductance is needed to reduce overvoltage shorts in the device during periods of hard high frequency switching. In addition, the inventive module has been tested as providing a power delivery of 17 kilowatts, and is capable of supporting 400 amps at 36 volts (i.e., a transient voltage drop of less than 10 volts) in starting mode, and 400 amps at 52 volts in alternator mode. As such, the module of the present invention is suitable for use in a 42 volt environment, particularly in a 42 volt internal combustion engine starter/alternator circuit.

The inventive half bridge module 2 provides a compact (the total height, i.e., thickness, of the described embodiment of the module is less than 0.75 inches), high power device which has an extremely low inductance. This low inductance allows the module 2 to support the current and current slew rates necessary to properly operate in an internal combustion engine starter/alternator circuit. Transient voltage drop in the module during engine starting is kept to a minimum.

Although the present invention has been described in relation to particular embodiments thereof, many other variations and modifications and other uses will become apparent to those skilled in the art.

What is claimed is:

1. A rectifying module, comprising:
   a thermally conductive base;
   a plurality of lower circuit boards, each of the plurality of lower circuit boards being adjacently positioned within the thermally conductive base along a same plane;
   at least one semiconductor device having a first surface, the first surface of the at least one semiconductor device being mounted to one of the plurality of lower circuit boards;
   a common terminal, the common terminal having a planar portion, the planar portion being in electrical contact with each of the plurality of lower circuit boards to electrically connect the same together;
   an electrical contact member; and
   an upper circuit board, including a connector providing external access for drive signals for the at least on semiconductor device, the electrical contact member connecting the connector with at least one of the plurality of lower circuit boards.

2. The module according to claim 1, further comprising at least one contact pin, the contact pin being used to provide the electrical contact between the upper circuit board and one of the plurality of lower circuit boards.

3. The module according to claim 2, wherein the contact pin includes a curved portion to form a resilient contact.

4. The module according to claim 1, further comprising two voltage terminals, each of the two voltage terminals being coupled to a different one of the plurality of the lower circuit boards.

5. The module according to claim 4, wherein the two voltage terminals extend from the plurality of lower circuit boards at differing distances.

6. The module according to claim 1, wherein the at least one semiconductor device further comprises a second surface located opposite the first surface, the second surface being coupled to one of the plurality of lower circuit boards by at least one wire bond.

7. The module according to claim 6, wherein the at least one wire bond is "S"-shaped such that an attachment point on the one lower circuit board is angularly displaced from an attachment point on the second surface.

8. The module according to claim 7, wherein the at least one semiconductor device is a MOSFET device and the attachment point of the second surface is a source region.

9. The module according to claim 8, wherein the module forms a half bridge rectifier.

10. The module according to claim 9, wherein the module is implemented in a 42 volt internal combustion engine starter/alternator circuit.

11. The module according to claim 8, wherein a total package inductance of the module is less than approximately 8.4 nanoHenries.

12. The module according to claim 1, wherein a total thickness of the module is less than approximately 0.75 inches.

13. A half bridge rectifying module for use in an internal combustion engine starting/alternator circuit, the module comprising:
   a thermally conductive base;
   a plurality of lower circuit boards, each of the plurality of lower circuit boards being adjacently positioned within the thermally conductive base along a same plane;
   at least one MOSFET semiconductor device having a first surface, the first surface of the at least one MOSFET semiconductor device being mounted to one of the plurality of lower circuit boards;
   a common terminal, the common terminal having a planar portion, the planar portion being in electrical contact with each of the plurality of lower circuit boards to electrically connect the same;
   an electrical contact member; and
   an upper circuit board including a connector providing external access for drive signals for the at least one MOSFET semiconductor device, the electrical contact member connecting the connector with at least one of the plurality of lower circuit boards.

14. The half bridge rectifier module according to claim 13, further comprising two voltage terminals, each of the two voltage terminals being coupled to a different one of the plurality of the lower circuit boards.

15. The half bridge rectifier module according to claim 14, wherein the two voltage terminals extend from the plurality of lower circuit boards at differing distances.

16. The half bridge rectifier module according to claim 13, wherein the at least one MOSFET semiconductor device further comprises a second surface located opposite the first surface, the second surface being coupled to the one of the plurality of lower circuit boards by at least one wire bond.

17. The half bridge rectifier module according to claim 16, wherein the at least one wire bond is "S"-shaped such that an attachment point on the one of the plurality of lower circuit board is angularly displaced from an attachment point on the second surface.

18. The half bridge rectifier module according to claim 17, wherein the attachment point of the second surface is a source region.

19. The half bridge rectifier module according to claim 13, wherein a total package inductance of the module is less than approximately 8.4 nanoHenries.

20. The half bridge rectifier module according to claim 13, wherein a total thickness of the module is less than approximately 0.75 inches.

21. A rectifying module, comprising:
    a thermally conductive base;
    a lower circuit board positioned within the thermally conductive base;
    at least one MOSFET semiconductor device having:
        a first surface, the first surface of the at least one MOSFET semiconductor device being a drain surface mounted to the lower circuit board;
        a second surface, the second surface being opposite the first surface and being coupled to the lower circuit board by at least one "S"-shaped wire bond, an attachment point on the lower circuit board being angularly displaced from an attachment point on the second surface;
    a common terminal, the common terminal having a planar portion, the planar portion being in electrical contact with the lower circuit board;
    a plurality of voltage terminals, each of the plurality of voltage terminals being coupled to the lower circuit board and extending at different distances therefrom;
    an electrical contact member; and
    an upper circuit board, including a connector providing external access for drive signals for the at least one MOSFET semiconductor device, the electrical contact member connecting the connector with the lower circuit board.

22. A module having a reduced inductance comprising:
    a first circuit board and a second circuit board each having defined on an electrically conductive layer thereof a common source bus for electrical connection to a source region of at least one power semiconductor device, a common drain bus for electrical connection to a drain region of said at least one power semiconductor device, and a gate connection pad for electrical connection to a gate region of the at least one semiconductor device; and
    a common terminal including an upper portion spaced from a lower portion, the lower portion being narrower than the upper portion to reduce the induction of the module, the lower portion being in electrical contact with the first and the second circuit boards.

23. The module of claim 22, further comprising a plurality of semiconductor power switching devices each having a source region thereof electrically connected to one of the common source buses of the first and second circuit boards.

24. The module of claim 22, further comprising a plurality of semiconductor power switching devices each having a drain region thereof electrically connected to one of the common drain buses of the first and second circuit boards.

25. The module of claim 22, further comprising a negative terminal and a positive terminal each in electrical contact with one of the common source bus of the second circuit board and the common drain bus of the first circuit board.

26. The module of claim 25, wherein the negative terminal and the positive terminal are positioned close to one another to reduce the inductance of the module.

27. The module of claim 23, wherein the source region on each one of the semiconductor devices is connected to the respective common source bus via at least one bonding wire.

28. The module of claim 24, wherein the gate region on each one of the semiconductor devices is connected to the respective gate connection pad via at least one bonding wire.

29. The module of claim 22, wherein at least one of the circuit boards includes a source sense pad for connecting to the source region of the at least one semiconductor device, the source sense pad being disposed near the gate pad.

30. The module of claim 22, wherein the upper portion of the common terminal is positioned over the lower portion.

31. The module of claim 22, wherein the common terminal is in electrical contact with the common source bus of the first circuit board, and the drain bus of the second circuit board.

32. The module of claim 22, wherein at least one of the circuit boards has defined on an electrically conductive layer thereof contact pads for a thermistor.

33. A module having a reduced inductance comprising:
    a first circuit board and a second circuit board each having defined on an electrically conductive layer thereof a common source bus for electrical connection to a source region of at least one power semiconductor device, a common drain bus for electrical connection to a drain region of said at least one power semiconductor device, and a gate connection pad for electrical connection to a gate region of the at least one semiconductor device;
    a negative terminal in electrical contact with the first circuit board; and
    a positive terminal in electrical contact with the second circuit board;
        wherein the positive terminal and the negative terminal are positioned close to one another to reduce the inductance of the module.

34. The module of claim 33, further comprising a common terminal including an upper portion spaced from a lower portion, the lower portion being narrower than the upper portion and in electrical contact with a contact region of the common source bus of the first circuit board, and a contact region of the drain bus of the second circuit board.

35. The module of claim 34, wherein the upper portion of the common terminal is positioned over the lower portion to reduce the inductance of the module.

36. The module of claim 35, wherein the negative terminal is in electrical contact with the common drain bus of the first circuit board, and the positive terminal is in electrical contact with the common source bus of the second circuit board.

37. A module having a reduced inductance comprising:
    at least one semiconductor power switching device;
    a circuit board having defined on an electrically conductive layer thereof a common source bus electrically connected to a source region of the at least one semiconductor device via at least one bond wire, the at least one bond wire being connected at a first end thereof to a source connection point on the source region of the at least one semiconductor device and connected at a second end thereof to a bus connection point on the common source bus, wherein the bond wire is shaped so that the source connection point and the bus connection point are angularly displaced so that they are not directly opposite one another to reduce the inductance of the module.

38. The module of claim 37, wherein the source connection point and the bus connection point are slightly offset to reduce the inductance of the module.

39. A rectifying module comprising:
   at least one circuit board having defined on an electrically conductive layer thereof,
   a common drain bus, the common drain bus including at least two substantially parallel spaced apart portions for electrical connection with a drain region of a semiconductor power device, the parallel portion being integral with a contact portion for making electrical contact with a terminal;
   a common source bus substantially parallel to the parallel portions of the common drain bus and disposed therebetween for connecting to a source region of a semiconductor device, the common source bus including a contact portion for making electrical contact with another terminal; and
   at least one gate pad for making electrical connection with a gate region of a semiconductor device, the gate pad being disposed near one of the parallel portions of the common drain bus.

40. The module of claim 39, further comprising a source sense pad defined on the at least one circuit board, the source pad being defined near the gate pad.

41. The module of claim 39, wherein the circuit board is an insulated metal substrate.

42. A module comprising:
   a circuit board having defined on a conductive layer thereof at least one gate pad for electrical connection to a gate region of a power semiconductor device and at least one source sense pad for electrical connection with a source region of the at least one semiconductor device, wherein the gate pad and the source sense pad are disposed as closed as possible to one another to reduce the inductance of the module.

43. The module of claim 42, wherein the gate pad is connected to the gate region via a wire bond having a length, and the source sense pad is connected to the source region by another wire bond having a length, the length of the wire bonds being as short as possible to reduce the inductance of the module.

* * * * *